United States Patent [19]  [11]  4,252,888
Rohloff  [45]  Feb. 24, 1981

[54] SOLDER MASK COMPOSITION

[75] Inventor: Robert R. Rohloff, Afton, Minn.

[73] Assignee: Minnesota Mining and Manufacturing Company, St. Paul, Minn.

[21] Appl. No.: 124,698

[22] Filed: Feb. 26, 1980

[51] Int. Cl.³ .............................................. G03C 1/68
[52] U.S. Cl. .............................. 430/281; 204/159.15; 204/159.16; 430/285; 430/286; 430/288
[58] Field of Search .............. 430/281, 285, 286, 288; 204/159.15, 159.16; 526/303, 304, 306, 307, 320, 322, 328, 333

[56] References Cited

U.S. PATENT DOCUMENTS

| 3,661,576 | 5/1972 | Crary | 430/288 |
| 4,003,877 | 1/1977 | Lipson et al. | 430/281 |
| 4,064,287 | 12/1977 | Lipson et al. | 430/288 |

Primary Examiner—Jack P. Brammer
Attorney, Agent, or Firm—Cruzan Alexander; Donald M. Sell; Gerald F. Chernivec

[57] ABSTRACT

A photopolymerizable composition which is screen-printable and has utility as a solder mask, the composition comprising aryloxyalkyl acrylate monomers or prepolymers, a diacrylate diluent, a monofunctional monomer and a free-radical initiating system.

7 Claims, No Drawings

SOLDER MASK COMPOSITION

BACKGROUND OF THE INVENTION

This invention is directed to a novel composition useful in preparation of solder mask coatings. More specifically, the invention relates to a liquid photopolymerizable composition which is capable of application by means of screen printing to a substrate, following which the composition may be converted to a dry, highly resistant coating without necessity for evaporation of solvents and/or thermal curing.

Solder mask coatings are typically used on quality printed circuit boards where molten solder, by a process known as wave soldering, is used to insure good interconnections between the components and the circuitry. In such cases, a solder mask must be extremely resistant to heat, impervious to a wide range of solvents, strongly adherent to a wide variety of metallic and non-metallic substrates, and chemically resistant to the conventional rosin-based fluxes. Furthermore, since solder masks are usually left on the circuitry as a protective coating, same must also have long term durability and excellent electrical insulating properties.

Conventional solder mask or resist coatings of the prior art typically contain a significant amount of solvent, which must be removed from the coating, and also typically are based on systems which require thermal curing. Such systems consume a great deal of energy and time, and the solvent vapors contained therein are typically pollutants.

For these reasons, over the last several years there has been increased interest in utilizing solder masks which are curable by ultraviolet radiation as opposed to the foregoing systems, the incentive for same being obvious. Recently, U.S. Pat. Nos. 4,003,877 and 4,064,287 have issued which disclose a photopolymerizable composition which is asserted to be useful as a solder mask. The photopolymerizable materials disclosed therein are screen-printable, a conventional technique for the application of solder resists or masks to a substrate, and contain from 35 to 70 percent by weight of an aryloxyalkyl acrylate monomer or prepolymer, from about 15 to about 45 percent by weight of a photopolymerizable diluent containing at least one terminal ethylenic group, and a free-radical generating system activatable by actinic radiation.

I have now found a composition, suitable for use as a solder mask, which is based on the foregoing aryloxyalkyl acrylates together with hereinafter defined diacrylate diluents and styrene and its monofunctional analogs.

SUMMARY OF THE INVENTION

In accordance with the invention there is provided a photopolymerizable composition suitable for use as a solder mask, the composition comprising from about 15 to about 85 percent by weight of an aryloxyalkyl acrylate; from about 15 to about 85 percent by weight of a diacrylate diluent, and an effective amount of a monofunctional monomer selected from the group consisting of styrene and its monofunctional analogs.

This composition provides increased wave solder resistance over prior art solder masks.

DETAILED DESCRIPTION OF THE INVENTION

The aryloxyalkyl acrylate monomers and prepolymers useful in my invention are the reaction products of epoxy compounds or omega-hydroxy ethers and unsaturated carboxylic acids. The carboxylic acids may be mono- or dicarboxylic acids containing from 3 to 18 carbon atoms. Alpha, beta-unsaturated carboxylic acids such as acrylic and methacrylic acids are preferred.

Monomers and prepolymers of the above type are commercially available under the tradenames of "Epocryl" (Shell Chemical Company), "Derakane" (Dow Chemical Company), "Nupol" (Freeman Chemical Company), and SR-348 and SR-349 (Sartomer Resins Company).

The use of aryloxyalkyl acrylate monomers and prepolymers in dry-film photoresists suitable for the manufacture of etched parts has been disclosed in U.S. Pat. No. 3,661,576.

The aryloxyalkyl acrylates can be described as having the following general formula:

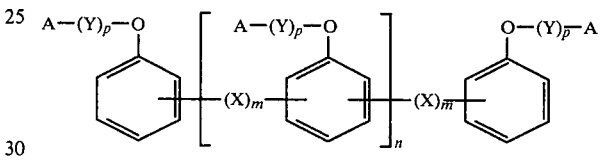

wherein X may be a methylene, an alkyl-substituted methylene group, a dialkyl-substituted methylene group, a carbonyl group, a sulfide, a sulfoxide, a sulfone, an amine, an alkyl-substituted amine, an ethylene ether, a propylene ether, a 2-hydroxypropylene ether, wherein each alkyl group may have from 1 to 8 carbon atoms, or any combination thereof; Y may be ethyl, propyl, 2-hydroxypropyl, or other lower alkyl or hydroxyalkyl groups having up to 8 carbon atoms; A may be an unsaturated acryloxy group having from 3 to 18 carbons, preferably acryloxy or methacryloxy; and n may be 9 through 20, m may be 0 or 1, and p may be 0 or 1.

In addition, the aromatic rings shown in the formula may be ring-substituted with 1 to 4 additional substituents such as chlorine or bromine.

I have ascertained that from 15 to 85, and preferably from 15 to 40, percent by weight of the aryloxyalkyl acrylates can be included in my photopolymerizable composition.

In addition to the foregoing, a diacrylate diluent must be included in the composition, examples of such diluents including tetraethylene glycol diacrylate, tetraethylene glycol dimethacrylate, 1,3-butylene glycol diacrylate, 1,3-butylene glycol dimethacrylate, diethylene glycol diacrylate, diethylene glycol dimethacrylate, triethylene glycol diacrylate, triethylene glycol dimethacrylate, polyethylene glycol dimethacrylate, pentaerythritol triacrylate, trimethylolpropane triacrylate, 1,6-hexane diol diacrylate, polyethylene glycol diacrylate, and divinyl benzene. Of the foregoing, the 1,3-butylene glycol diacrylate, triethylene glycol diacrylate and tetraethylene glycol diacrylate are preferred diluents, with the latter being the most preferred. From about 15 to about 85, and preferably from about 40 to about 70, percent by weight of the composition can be made up of the diacrylate diluent.

U.S. Pat. No. 4,003,877 teaches that monofunctional monomers may be included as polymerizable diluents, but same are taught to be generally undesirable because of volatility, and because the cured coating resulting therefrom exhibits a lack of durability. Surprisingly, I have ascertained that the inclusion of an effective amount of certain monofunctional monomers are essential to a production of a reproduceable coating having the required flexibility, adhesion, resistance to molten solder and solvent resistance. These monofunctional monomers include styrene and its monofunctional analogs, examples of same being vinyl toluene, α-methyl styrene, and N-vinyl-2-pyrrollidone, with vinyl toluene being preferred.

The specific concentration level of the foregoing monofunctional monomers in the composition depend on the concentration of the diacrylate diluent component thereof when compared to the aryloxyalkyl acrylate component. For example, when the ratio of the diacrylate diluent to the aryloxyalkyl acrylate is about 25 to 75, I have ascertained that from about 1 percent to about 50 percent by weight of the monofunctional monomer can be utilized to impart increased wave solder resistance to the composition. When the concentration of the diacrylate diluent is increased to provide a ratio to the aryloxyalkyl acrylate of 50 to 50, or further to 75 to 25, the concentration of monofunctional monomer providing the increased wave solder resistance is from about 1 to about 30 percent by weight of the composition.

Elimination of the monofunctional monomers from the composition has provided products having reduced wave solder resistance.

In addition, a photoinitiator system must be used in the composition, same being preferably those which are activatable by actinic light and thermally inactive at 185° C. and below.

The concentration thereof in the composition varies widely depending on the particular photoinitiator selected. The optimum amount, can be readily determined by simple experimentation. Preferred initiators are the acyloin ethers such as the benzoin ethers, particular benzoin isobutyl ether, alkyl-substituted anthraquinones such as 2-tert-butylanthraquinone, and α, α-diethoxyacetophenone. The most preferred initiator is 2,2-dimethoxy-2-phenylacetophenone, commercially available as Irgacure 651 from Ciba Geigy.

Other initiators which may be used include the substituted or unsubstituted polynuclear quinones, such as 9,10-anthraquinone; 1-chloroanthraquinone; 2-chloroanthraquinone; 2-methylanthraquinone; 2-ethylanthraquinone; octamethylanthraquinone; 1,4-naphthoquinone; 9,10-phenanthraquinone; 2,1-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; sodium salt of anthraquinone alpha-sulphonic acid; 3-chloro-2-methylanthraquinone; retenequinone; 7,8,9,10-tetrahydronaphthacenequinone; 1,2,3,4-tetrahydrobenz(a)anthracene-7,12-dione.

The following photoinitiators, described in U.S. Pat. No. 2,760,863, some of which may be thermally active at temperatures as low as 85° C., are also useful: vicinal ketaldonyl compounds, such as diacetyl and benzil; alpha-ketaldonyl alcohols, such as benzoin and pivaloin; alpha-hydrocarbon-substituted aromatic acyloins; alpha-methylbenzoin; alpha-allylbenzoin; and alpha-phenylbenzoin.

Silver persulfate is also useful as a free-radical generating initiator activatable by actinic radiation. Certain aromatic ketones, e.g., benzophenone and 4,4'-bis-dialkylaminobenzophenones, are also useful.

In addition to the components of the photopolymerizable composition of my invention enumerated above, additional materials are typically added in order to obtain the properties necessary for using the composition as a screen imaging composition. Such materials can include thermal polymerization inhibitors, which typically act as antioxidants and stabilizers and include p-methoxyphenol, hydroquinone and alkyl and aryl-substituted hydroquinones and quinones, tert-butyl catechol, pyrogallol, copper resinate, napthylamines, beta-naphthol, cuprous chloride, 2,6-di-tert-butyl p-cresol, 2,2-methylenebis-(4-ethyl-6-t-butylphenol), phenothiazine, pyridine, nitrobenzene, dinitrobenzene, p-toluquinone, chloranil, aryl phosphites, and aryl alkyl phosphites.

To optimize my composition for use as a screen printing coating, it is essential that same have appropriate viscosity and thixotropic properties. While useful compositions can be obtained by the combination of the main components listed above, it is nevertheless generally desirable to add thixotropic agents, leveling agents, and defoamers to achieve a viscosity of from about 5,000 to 200,000 centipoise and a thixotropic index of from about 1.00 to 6.00.

The thixotropic agents which may be used are well known to those skilled in the art. Examples of these materials are Bentone (a trademark of National Lead Company for an organic base salt of a clay mineral, e.g., montmorillonite) and other silicate-type materials. Other thixotropic agents are the aluminum, calcium and zinc salts of fatty acids, such as lauric or stearic acid, e.g., Zinc Soap No. 26 (trademark of the Witco Chemical Co., Inc.); and fumed silicas such as Cab-o-Sil and Aerosil (trademarks of the Cabot Corporation and Degussa Corporation, respectively).

The leveling agents and defoamers which may be used include Modaflow and Multiflow, trademarks of the Monsanto Company for resin modifiers. Other leveling and flowout agents include aluminum stearate, calcium stearate, sucrose benzoate, and high molecular weight nonionic surface active agents.

Additional ingredients may also be added to the coatings of my invention, which can include plasticizers, pigments or colorants, fillers, and adhesion promoters. The skilled artisan may readily ascertain the desirable amount of such materials.

Commonly used fillers are barium sulfate, talc, calcium carbonate, zinc oxide and silicas and silicates. Suitable plasticizers, used to increase the flexibility of the film, include the polyfunctional esters such as dioctylphthalate, tricresyl phosphate, polyethylene glycol acetate, and pentaerythritol tetramercaptopropionate.

In practicing the process of the invention, any of the well known screen printing techniques may be employed. The photopolymerizable material is applied by pouring a measured quantity on the screen. The squeegee is drawn uniformly and with even pressure to scrape the ink across the entire surface of the screen, thereby transferring the ink to the substrate below. Film thicknesses ranging from 0.006 mm to 0.130 mm are applied by this procedure. Film thickness can be measured by such means as micrometer or beta-ray backscattering.

After the print is completed, the screen is lifted, then the wet substrate is removed and passed through the ultraviolet radiation source. Such sources include carbon arcs, mercury vapor lamps, fluorescent lamps with ultraviolet radiation-emitting phosphors, argon glow lamps, electronic flash units and photographic flood lamps. Of these, the medium pressure mercury vapor lamps are the most suitable. The period of exposure, as will be readily understood by those skilled in the art, will be dependent on the film thickness, the light intensity, the distance from the light source to the coating, and the temperature of the operation. A typical exposure time using a 200 watt per linear inch medium pressure mercury vapor lamp at a distance of 4 inches is about 5 seconds. After the exposure, the coating is completely cured and may be passed directly to the next processing step to modify the uncoated portion of the substrate.

The photopolymerizable composition of my invention will now be more specifically described by the use of the following non-limiting examples, wherein all parts are by weight unless otherwise specified.

In the following examples, the substrate consisted of a 0.062 inch thick laminate (epoxy glass) having printed wiring (copper) on one side. Typically, suppliers of such substrates are Westinghouse, NVF Corp. and General Electric.

Prior to applying a coating of my composition, the surface of the printed circuit board was cleaned using a soft cloth and a cleaner designed to remove excess oxide from the copper surface thereof, in this case a cleaner commercially available as Shipley 11.

The solder mask was applied by screen printing the desired pattern over the printed circuitry. The examples herein utilize a 280 mesh stainless steel screen which applied 1.0 mil thickness of coating.

The solder mask coating was cured using a single lamp Ashdee 200 watt per inch medium pressure ultraviolet radiation machine. Three passes through the machine at 8 feet per minute per path were utilized. This cure amounts to a power density integral of between 0.5 and 0.6 watts per square centimeter of exposed surface area. The cured board was then allowed to age a minimum of 24 hours prior to testing.

Sample boards were tested for a number of parameters, among which were solder wave resistance, adhesion, and solvent resistance. The first step was to pass the board over a wave of liquid tin/lead (60-40) solder at 500° F. The machine utilized for such tests was a Hollis Wave Reflow machine. Immediately prior to reflow, the surface to be reflowed, i.e., that onto which the solder mask has been applied, is coated (brushed) with a flux to aid in the reflowing procedure. The flux utilized was Alpha 711-35. Following fluxing, the fluxed board was mounted in a processing rack which was then fastened to the conveyor chain on the reflow machine. The conveyor moves the board over an infrared preheater section and then over the solder wave, with approximately 3 to 5 seconds dwell time in the wave being obtained.

Once the board has been soldered, it is removed from the rack and examined. Failure of the solder mask to withstand this wave test can be exhibited by blistering or delamination of the solder mask coating, by severe discoloration, and by softening to the point where the solder has wicked under the solder mask.

The second step in the evaluation was to remove the flux, which should be done within several minutes of reflow if possible. Removal is carried out by immersing the board in a vapor degreaser containing solvent, which was 1,1,1-trichloroethane in the examples. Immersions in the solvent vapors were undertaken for 2 minutes.

Upon removal from the degreaser, the board was examined for attack, same being exhibited by swelling, lifting, or severe softening of the solder mask coating. In addition to examination for solvent attack, the surface was observed as to how well same cleaned up during the degreasing step, the surface normally being clean, glossy, and free from scum or residues if an acceptable coating is present.

For comparison purposes, a number ranging from 1 to 5 was assigned to the coating during evaluation, with the higher the number the better the coating performance. Visual observation was utilized to ascertain the numerical rating assigned to an example.

In particular, 2 parameters are observed. The first was the hold, or how well the coating contained the solder while going over the wave. For example, if the openings do not enlarge or undercut, the hold is ascertained to be good. The second parameter was delamination, which was used to determine how well the coating remained adhered to the substrate during the wave operation. In general, two forms of delamination may be observed. The first is a slight lifting, but without breakage of the film. Same can be noticeable by light colored spots. The second type of delamination is more severe, that being where the coating actually ruptures and breaks apart. The numerical designations given for the formulations which follow are as follows:

1. gross coating degradation—unacceptable
2. medium amounts (50 percent of area) of coating degradation—unacceptable
3. minor amounts (10 percent of coating area) of coating degradation—unacceptable
4. minute amounts or isolated areas of coating degradation—marginally acceptable
5. no coating degradation—acceptable.

EXAMPLE 1

To a suitable container were added 21.7 parts of tetraethylene glycol diacrylate and 65.9 parts of a diacrylated bisphenol A resin. The mixture was brought to 60° C., following which Irgacure 651, tradename for a photoinitiator from the Ciba Geigy Company, in the amount of 4 parts, were added, using gentle stirring until solvation occurred, at approximately 10 minutes. A blue pigment dispersion, in the amount of 2 parts, was added and mixed in completely. Then, Aerosil 380, tradename for a fumed silica from the Degussa Company, in the amount of 8.0 parts, was added and gently stirred until a uniform mixture was obtained. Following cooling to room temperature, milling of the mixture was undertaken on a conventional 3 roll mill, using a 0.020 inch orifice setting between the slowest and medium speed roll, a 0.005 inch orifice between the medium and fastest speed rolls.

In accordance with the aforementioned valuation of the coating, same was given a 1.0 value relative to the wave solder test. When 4.2 percent vinyl toluene was added to the foregoing mixture, the wave test indicated a 4.5 value, and similar results were obtained at levels of vinyl toluene of approximately 50.0 percent, while keeping the ratio of the tetraethylene glycol diacrylate to the acrylated bisphenol A of 25 to 75.

When the ratio of tetraethylene glycol diacrylate to the diacrylated bisphenol A is reduced to 50 parts per 50 parts, similar results were obtained through a level of vinyl toluene of approximately 30 percent by weight.

What is claimed is:

1. A screen-printable photopolymerizable composition comprising from about 15 to about 85 percent by weight of an aryloxyalkyl acrylate having the general formula:

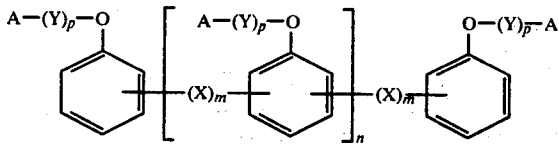

wherein X is a methylene, an alkyl-substituted methylene group, a dialkyl-substituted methylene group, a carbonyl group, a sulfide, a sulfoxide, a sulfone, an amine, an alkyl-substituted amine, an ethylene ether, a propylene ether, a 2-hydroxypropylene ether, wherein each alkyl group may have from 1 to 8 carbon atoms, or any combination thereof; Y is ethyl, propyl, 2-hydroxypropyl, or other lower alkyl or hydroxyalkyl groups having up to 8 carbon atoms; A is an unsaturated acryloxy group having from 3 to 18 carbons, preferably acryloxy or methacryloxy; and n is 0 through 20, m is 0 or 1, and p is 0 or 1; from about 15 to about 85 percent by weight of a diacrylate diluent; an effective amount of a monofunctional monomer selected from the group consisting of styrene and its monofunctional analogs; and a free-radical generating addition polymerizing initiating system.

2. The photopolymerizable composition of claim 1 wherein said aryloxyalkyl acrylate constitutes from about 15 to about 40 percent by weight of said composition.

3. The photopolymerizable composition of claim 1 wherein said diacrylate diluent constitutes from about 40 to about 70 percent by weight of said composition.

4. The photopolymerizable composition of claim 1 wherein the weight ratio of said diacrylate diluent to said aryloxyalkyl acrylate is about 1 to 3, and wherein said monofunctional monomer constitutes from about 1 to about 50 percent by weight of said composition.

5. The photopolymerizable composition of claim 1 wherein the ratio of said diacrylate diluent to said aryloxyalkyl acrylate is from about 1 to 1 to 3 to 1, and said monofunctional monomer constitutes from about 1 to about 30 percent by weight of said composition.

6. The photopolymerizable composition of claim 1 wherein said diacrylate diluent is selected from the group consisting of 1,3-butylene glycol diacrylate, triethylene glycol diacrylate and tetraethylene glycol diacrylate.

7. The photopolymerizable composition of claim 1 wherein said monofunctional monomer is vinyl toluene.

* * * * *